(12) United States Patent
Shinmyo et al.

(10) Patent No.: US 10,644,870 B2
(45) Date of Patent: May 5, 2020

(54) CLOCK RECOVERY SYSTEM

(71) Applicant: Panasonic Intellectual Property Management Co., Ltd., Osaka (JP)

(72) Inventors: Akinori Shinmyo, Hyogo (JP); Syuji Kato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/697,158

(22) Filed: Nov. 26, 2019

(65) Prior Publication Data

US 2020/0099507 A1    Mar. 26, 2020

Related U.S. Application Data

(63) Continuation of application No. PCT/JP2018/007109, filed on Feb. 27, 2018.

(30) Foreign Application Priority Data

Jun. 29, 2017 (JP) .................. 2017-127547

(51) Int. Cl.
*H04L 7/033* (2006.01)
*H04L 7/00* (2006.01)
(Continued)

(52) U.S. Cl.
CPC .......... *H04L 7/0331* (2013.01); *H03L 7/081* (2013.01); *H03L 7/099* (2013.01); *H04L 7/0025* (2013.01); *H04L 7/0037* (2013.01); *H04L 7/0087* (2013.01)

(58) Field of Classification Search
CPC ... H04L 7/0331; H04L 7/0025; H04L 7/0037; H04L 7/0087; H03L 7/081; H03L 7/099
See application file for complete search history.

(56) References Cited

U.S. PATENT DOCUMENTS 7,424,081 B2 * 9/2008 Suzuki .................. H03L 7/089
375/371
7,505,541 B1  3/2009 Brunn et al.
(Continued)

FOREIGN PATENT DOCUMENTS

JP  2006-109208 A  4/2006
WO  2008/012928 A1  1/2008

OTHER PUBLICATIONS

International Search Report issued in corresponding International Patent Application No. PCT/JP2018/007109, dated May 29, 2018, with English translation.

*Primary Examiner* — Freshteh N Aghdam

(74) *Attorney, Agent, or Firm* — McDermott Will & Emery LLP

(57) ABSTRACT

A clock recovery system includes: a sampler that samples reception data with 2N phase clocks and outputs 2N×M sampling signals; a data selector that selects n×M recovery signals from the 2N×M sampling signals and outputs the n×M recovery signals; a phase comparator that outputs, for each of the n×M recovery signals, a phase comparison signal based on the recovery signal, a first sampling signal sampled with a first clock that leads by one or more phases from a sampling clock, and a second sampling signal sampled with a second clock that delays by one or more phases from the sampling clock; a controller that designates n based on a data rate of the reception data; and a multiphase clock generator that generates and outputs the 2N phase clocks based on the phase comparison signal and n.

9 Claims, 13 Drawing Sheets

(51) Int. Cl.
 *H03L 7/081* (2006.01)
 *H03L 7/099* (2006.01)

(56) References Cited

U.S. PATENT DOCUMENTS

| | | |
|---|---|---|
| 9,312,865 B2 | 4/2016 | Song et al. |
| 2006/0078078 A1 | 4/2006 | Moriizumi |
| 2006/0262891 A1* | 11/2006 | Faulkner ............... H03L 7/00 375/371 |
| 2010/0002822 A1* | 1/2010 | Arima ................. H03L 7/0814 375/371 |
| 2016/0344378 A1* | 11/2016 | Saito .................. H03L 7/087 |

* cited by examiner

PHASE COMPARISON MODE 1 (WITH DEAD BAND)

PHASE COMPARISON MODE 2 (WITHOUT DEAD BAND)

PHASE COMPARISON MODE A

PHASE COMPARISON MODE B

PHASE COMPARISON MODE C

CLOCK RECOVERY SYSTEM

CROSS REFERENCE TO RELATED APPLICATIONS

This application is a U.S. continuation application of PCT International Patent Application Number PCT/JP2018/007109 filed on Feb. 27, 2018, claiming the benefit of priority of Japanese Patent Application Number 2017-127547 filed on Jun. 29, 2017, the entire contents of which are hereby incorporated by reference.

BACKGROUND

1. Technical Field

The present disclosure relates to a clock recovery system.

2. Description of the Related Art

A clock recovery system that receives signals transmitted from outside is conventionally known (for example, see Japanese Unexamined Patent Application Publication No. 2006-109208 and U.S. Pat. No. 7,505,541 B1).

SUMMARY

A clock recovery system capable of receiving signals in a wider frequency band than conventional clock recovery systems is desired.

A clock recovery system according to one aspect of the present disclosure is a clock recovery system that receives reception data, the clock recovery system including: a sampler that samples the reception data with 2N phase clocks, and outputs 2N×M sampling signals per 1 clock cycle, where N and M are each an integer of 1 or more; a data selector that selects n×M recovery signals from the 2N×M sampling signals and outputs the n×M recovery signals per 1 clock cycle, where n is an integer of 1 or more and N or less; a phase comparator that, for each recovery signal of the n×M recovery signals per 1 clock cycle, outputs a phase comparison signal relating to phases of the 2N phase clocks based on the recovery signal, a first sampling signal sampled with a first clock that leads by one or more phases from a sampling clock for sampling the recovery signal, and a second sampling signal sampled with a second clock that delays by one or more phases from the sampling clock; a controller that designates a value of n based on a data rate of the reception data; and a multiphase clock generator that generates and outputs the 2N phase clocks whose frequency is 1/n of the data rate of the reception data, based on the phase comparison signal output from the phase comparator and the value of n designated by the controller, wherein the multiphase clock generator includes: a phase adjustor that generates a phase adjustment signal indicating the phases of the 2N phase clocks to be output, based on the phase comparison signal; a frequency adjustor that generates a frequency adjustment signal indicating the frequency of the 2N phase clocks to be output, based on the phase comparison signal; a PLL that: in the case where a reception clock synchronous with the reception data is input from outside, generates 2N phase PLL clocks by synchronization with the reception clock; and in the case where the reception clock is not input from outside, generates the 2N phase PLL clocks whose frequency is indicated by the frequency adjustment signal generated by the frequency adjustor and whose phases are based on the phase comparison signal; and a phase shifter that: in the case where the reception clock is input from outside, performs first phase adjustment on the 2N phase PLL clocks generated by the PLL to cause the 2N phase PLL clocks to have the phases indicated by the phase adjustment signal generated by the phase adjustor, and outputs the 2N phase PLL clocks subjected to the first phase adjustment as the 2N phase clocks; and in the case where the reception clock is not input from outside, outputs the 2N phase PLL clocks generated by the PLL as the 2N phase clocks without performing the first phase adjustment.

The clock recovery system of the above-described structure is capable of receiving signals in a wider frequency band than conventional clock recovery systems.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
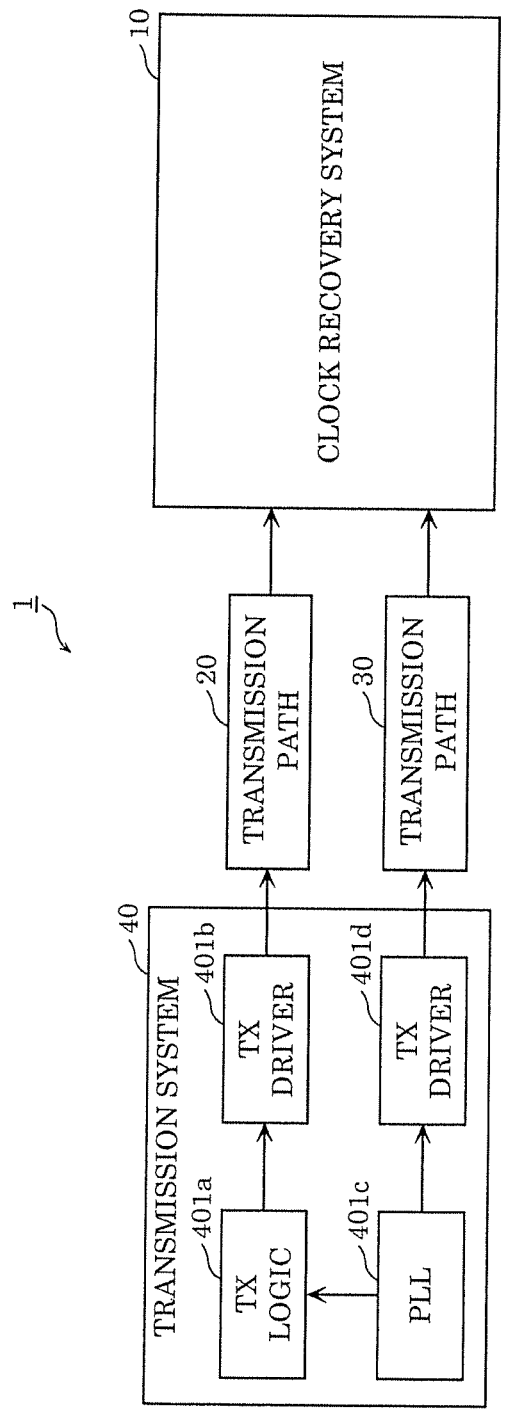
FIG. 1 is a block diagram illustrating a structure of a transmission and reception system according to Embodiment 1.

Circumstances Leading to Attainment of One Aspect of the Present Disclosure

With enhancement of video quality and audio quality in recent years, the amount of information transmitted between devices is increasing. This raises demand to improve signal transmission speed between devices. For example, in the case of displaying a moving image on a 8K4K panel having a pixel count of "7680×4320" in a display device conforming to HDMI® (High Definition Multimedia Interface), a signal transmission speed of 12 Gbps per lane is needed. Meanwhile, backward compatibility is important in HDMI®. For example, normal image output is required even in the case where a DVD player with a signal transmission speed of 250 Mbps is connected. Thus, inter-device communication in recent years needs to support not only ultrahigh-speed data transmission but also low-speed data transmission.

Japanese Unexamined Patent Application Publication No. 2006-109208 discloses a reception circuit capable of high-speed data reception. The reception circuit compares phases between data and first to fourth clocks of four phases obtained by shifting the phase of the half rate of the data by 90°. U.S. Pat. No. 7,505,541 B1 discloses a reception circuit capable of PAM4 reception.

However, with a simple combination of the conventional techniques described in Japanese Unexamined Patent Application Publication No. 2006-109208, U.S. Pat. No. 7,505,541 B1, etc., the frequency of the clock of the reception circuit is limited to the half rate of the data transmission rate. Accordingly, for example in the case of receiving data of 12 Gbps, the frequency of the clock of the reception circuit is very fast, i.e. 6 GHz. This puts very strict timing constraints on the phase comparison operation and the operations of digital circuits connected on the downstream side. In the case of receiving data of 250 Mbps, on the other hand, the frequency of the clock of the reception circuit is relatively slow, i.e. 125 MHz. In such a case, the delay time from data reception to clock phase adjustment is relatively long, and the response speed of the reception circuit is relatively low. Thus, reception characteristics degrade in the case of receiving data of a relatively low data transfer rate.

In view of the problem stated above, the inventors of the present disclosure conceived the following clock recovery system according to one aspect of the present disclosure.

A clock recovery system according to one aspect of the present disclosure is a clock recovery system that receives reception data, the clock recovery system including: a sampler that samples the reception data with 2N phase clocks, and outputs 2N×M sampling signals per 1 clock cycle, where N and M are each an integer of 1 or more; a data selector that selects n×M recovery signals from the 2N×M sampling signals and outputs the n×M recovery signals per 1 clock cycle, where n is an integer of 1 or more and N or less; a phase comparator that, for each recovery signal of the n×M recovery signals per 1 clock cycle, outputs a phase comparison signal relating to phases of the 2N phase clocks based on the recovery signal, a first sampling signal sampled with a first clock that leads by one or more phases from a sampling clock for sampling the recovery signal, and a second sampling signal sampled with a second clock that delays by one or more phases from the sampling clock; a controller that designates a value of n based on a data rate of the reception data; and a multiphase clock generator that generates and outputs the 2N phase clocks whose frequency is 1/n of the data rate of the reception data, based on the phase comparison signal output from the phase comparator and the value of n designated by the controller, wherein the multiphase clock generator includes: a phase adjustor that generates a phase adjustment signal indicating the phases of the 2N phase clocks to be output, based on the phase comparison signal; a frequency adjustor that generates a frequency adjustment signal indicating the frequency of the 2N phase clocks to be output, based on the phase comparison signal; a PLL that: in the case where a reception clock synchronous with the reception data is input from outside, generates 2N phase PLL clocks by synchronization with the reception clock; and in the case where the reception clock is not input from outside, generates the 2N phase PLL clocks whose frequency is indicated by the frequency adjustment signal generated by the frequency adjustor and whose phases are based on the phase comparison signal; and a phase shifter that: in the case where the reception clock is input from outside, performs first phase adjustment on the 2N phase PLL clocks generated by the PLL to cause the 2N phase PLL clocks to have the phases indicated by the phase adjustment signal generated by the phase adjustor, and outputs the 2N phase PLL clocks subjected to the first phase adjustment as the 2N phase clocks; and in the case where the reception clock is not input from outside, outputs the 2N phase PLL clocks generated by the PLL as the 2N phase clocks without performing the first phase adjustment.

In the clock recovery system of the above-described structure, the controller can designate n depending on the data rate of the reception data. In detail, the controller designates a relatively large value as n in the case where the data rate of the reception data is relatively high, and designates a relatively small value as n in the case where the data rate of the reception data is relatively low. The clock recovery system of the above-described structure is thus capable of receiving signals in a wider frequency band than conventional clock recovery systems.

A clock recovery system according to one aspect of the present disclosure will be described below, with reference to the drawings. Embodiments described below each show a specific example of the present disclosure. The numerical values, shapes, structural elements, the arrangement and connection of the structural elements, steps, the order of steps, etc. shown in the following embodiments are mere examples, and do not limit the scope of the present disclosure. Of the structural elements in the embodiments described below, the structural elements not recited in any one of the independent claims are structural elements that may be added optionally. Each drawing is a schematic, and does not necessarily provide precise depiction. In each embodiment described below, structural elements having the same functions as those in other embodiments are given the same reference marks, and their description is omitted.

Embodiment 1

Figure 2:
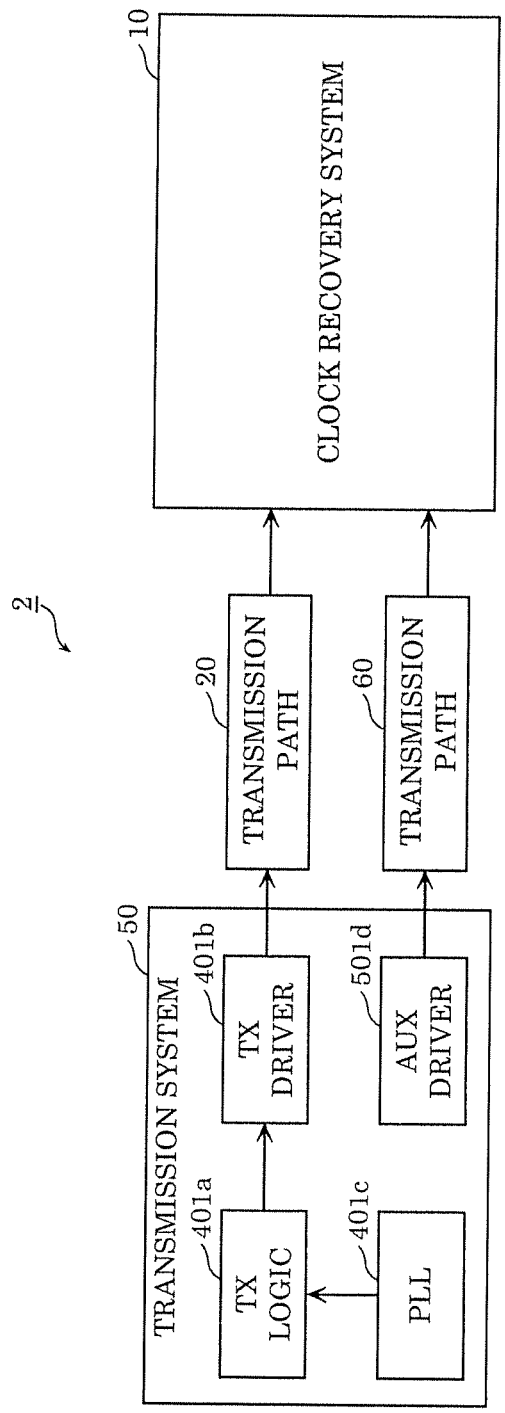
FIG. 2 is a block diagram illustrating a structure of a transmission and reception system according to Embodiment 1.

FIGS. 1 and 2 are block diagrams respectively illustrating structures of transmission and reception system 1 and transmission and reception system 2 each of which includes a clock recovery system according to Embodiment 1.

Transmission and reception system 1 includes clock recovery system 10 according to Embodiment 1, transmission path 20, transmission path 30, and transmission system 40, as illustrated in FIG. 1.

Transmission system 40 includes TX logic 401a that generates reception data RXDATA (logical signal), and TX driver 401b that outputs reception data RXDATA generated by TX logic 401a to transmission path 20. Transmission system 40 also includes PLL 401c that generates a clock, and supplies the clock to TX logic 401a and also outputs the clock to transmission path 30 via TX driver 401d.

This system is called a clock forward system, that is, a system in which the transmission-side system transmits, together with reception data RXDATA, a clock used when generating reception data RXDATA.

Transmission and reception system 2 includes clock recovery system 10, transmission path 20, transmission path 60, and transmission system 50, as illustrated in FIG. 2.

Transmission and reception system 2 differs from transmission and reception system 1 in that transmission system 50 includes AUX driver 501d instead of TX driver 401d in transmission system 40 in transmission and reception system 1, and outputs AUX data including information such as the data rate of and the number of lanes used for reception data RXDATA to transmission path 60 instead of outputting a clock to transmission path 30. Typically, AUX data has a lower data rate than reception data RXDATA. This system is called a clock embedded system, that is, a system in which the transmission-side system transmits, together with reception data RXDATA, AUX data including information relating to the data rate of reception data RXDATA.

Thus, clock recovery system 10 according to Embodiment 1 can be used in both of a clock forward system and a clock embedded system.

Figure 3:
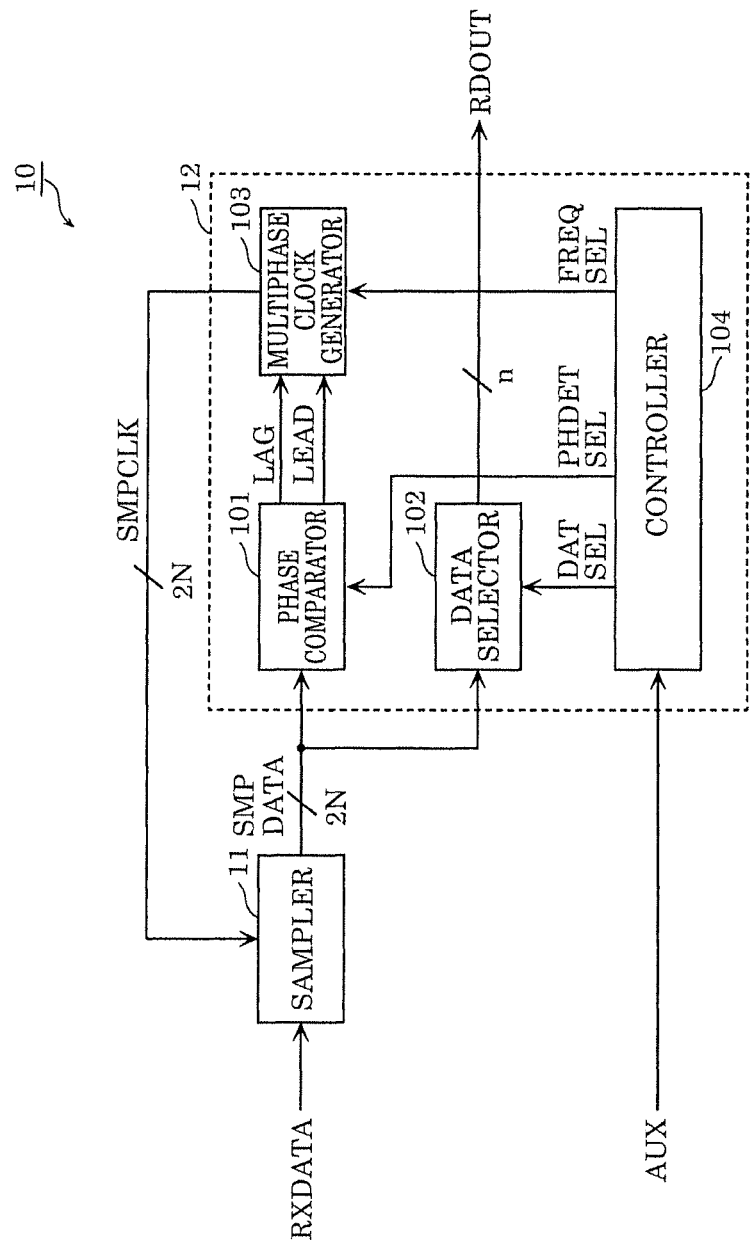
FIG. 3 is a block diagram illustrating a structure of a clock recovery system according to Embodiment 1.

FIG. 3 is a block diagram illustrating a structure of clock recovery system 10.

Clock recovery system 10 includes sampler 11 and clock recoverer 12, as illustrated in FIG. 3.

Sampler 11 samples reception data RXDATA that has passed through transmission path 20 with 2N phase clocks SMPCLK (N is an integer of 2 or more), and outputs 2N sampling signals SMPDATA per 1 clock cycle.

Clock recoverer 12 receives 2N sampling signals SMPDATA output from sampler 11, per 1 clock cycle. Clock recoverer 12 outputs 2N phase clocks SMPCLK, and also selects n recovery signals RDOUT (n is an integer of 1 or more and N or less) from 2N sampling signals SMPDATA and outputs selected n recovery signals RDOUT per 1 clock cycle.

Clock recoverer 12 includes phase comparator 101, data selector 102, multiphase clock generator 103, and controller 104. 2N sampling signals SMPDATA are supplied to phase comparator 101 and data selector 102.

Data selector 102 selects n recovery signals RDOUT from 2N sampling signals SMPDATA and outputs selected n recovery signals RDOUT, per 1 clock cycle.

Phase comparator 101, for each of n recovery signals RDOUT per 1 clock cycle, outputs a phase comparison signal relating to the phases of 2N phase clocks SMPCLK based on recovery signal RDOUT, a first sampling signal sampled with first clock CKLAG that leads by one or more phases from sampling clock CK for sampling recovery signal RDOUT, and a second sampling signal sampled with second clock CKLEAD that delays by one or more phases from sampling clock CK.

Controller 104 designates n based on the data rate of reception data RXDATA. Controller 104 also designates, from 2N phase clocks SMPCLK, one of the clocks that each lead by one or more phases from sampling clock CK as first clock CKLAG, and one of the clocks that each delay by one or more phases from sampling clock CK as second clock CKLEAD.

Multiphase clock generator 103 generates and outputs 2N phase clocks SMPCLK whose frequency is 1/n of the data rate of reception data RXDATA, based on the phase comparison signal output from phase comparator 101 and n designated by controller 104.

Figure 4:
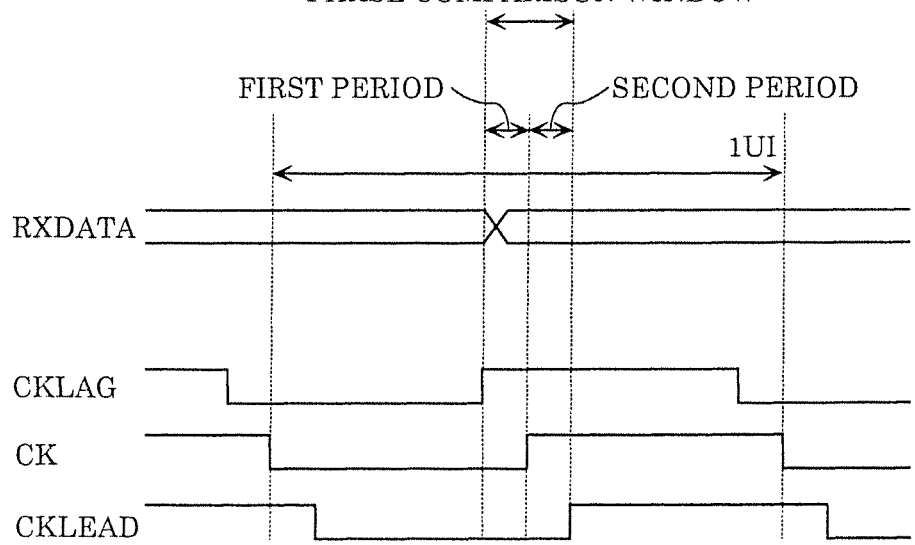
FIG. 4 is a timing chart illustrating phase comparison operation of a phase comparator.

FIG. 4 is a timing chart illustrating basic phase comparison operation of phase comparator 101.

Phase comparator 101 activates the phase comparison signal in the case where a data transition edge of reception data RXDATA is present in a phase comparison window defined by first clock CKLAG and second clock CKLEAD. More specifically, phase comparator 101 outputs first phase comparison signal LAG activated in the case where a data transition edge of reception data RXDATA is present in a first period between the timing of sampling by sampling clock CK and the timing of sampling by first clock CKLAG, based on the recovery signal and the first sampling signal. Phase comparator 101 outputs second phase comparison signal LEAD activated in the case where a data transition edge of reception data RXDATA is present in a second period between the timing of sampling by sampling clock CK and the timing of sampling by second clock CKLEAD, based on the recovery signal and the second sampling signal. The first phase comparison signal is a signal for delaying the phase of each of sampling clock CK, first clock CKLAG, and second clock CKLEAD. The second phase comparison signal is a signal for advancing the phase of each of sampling clock CK, first clock CKLAG, and second clock CKLEAD.

The first period and the second period are set so as not to include a data transition edge of reception data RXDATA in a state in which reception data RXDATA and sampling clock CK match in phase.

Detailed operation of phase comparator 101 will be described below, with reference to FIGS. 5A, 5B, and 5C.

Figure 5A:
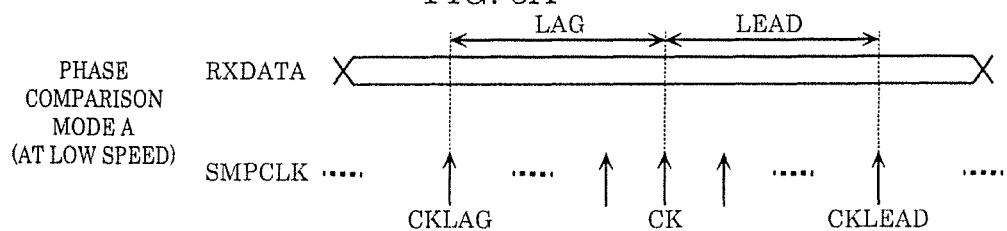
FIG. 5A is a timing chart illustrating phase comparison operation of the phase comparator.

FIG. 5A is a timing chart illustrating phase comparison operation of phase comparator 101 in the case where the data rate of reception data RXDATA is relatively low (e.g. approximately several hundred MHz). FIG. 5B is a timing chart illustrating phase comparison operation of phase comparator 101 in the case where the data rate of reception data RXDATA is relatively medium (e.g. approximately several GHz). FIG. 5C is a timing chart illustrating phase comparison operation of phase comparator 101 in the case where the data rate of reception data RXDATA is relatively high (e.g. approximately a dozen GHz).

Phase comparator 101 is supplied with 2N sampling signals SMPDATA obtained by sampling reception data RXDATA with 2N phase clocks SMPCLK, as mentioned above. In the case of selecting n signals out of 2N sampling signals SMPDATA as recovery signals RDOUT, the clock frequency of 2N phase clocks SMPCLK is 1/n of the data rate of reception data RXDATA.

In the case where the data rate of reception data RXDATA is highest, clock recovery system 10 may set relatively high data processing concurrency and keep the clock frequency of 2N phase clocks SMPCLK relatively low, in order to ensure a timing margin of the digital circuit on its downstream side and keep the maximum oscillation frequency of the PLL low. Accordingly, in such a case, controller 104 designates N which is a maximum value as the value of n, and phase comparator 101 performs the phase comparison operation in phase comparison mode C in FIG. 5C. In phase comparison mode C, all 2N pieces of sampling data are used for phase comparison. For example, in the case where a data transition edge of reception data RXDATA is present between the kth sampling clock CK(k) (k is an integer of 1 or more and N or less) and the (k−1)th sampling clock CKE(k−1), first phase comparison signal LAG(k−1) is activated. In the case where a data transition edge of reception data RXDATA is present between sampling clock CK(k) and sampling clock CKE(k), second phase comparison signal LEAD(k) is activated.

In the case where the data rate of reception data RXDATA is lowest, clock recovery system 10 may set relatively low data processing concurrency and keep the clock frequency of 2N phase clocks SMPCLK relatively high, in order to minimize the delay time from when the phase comparison operation is performed to when the phases of 2N phase clocks SMPCLK are adjusted. Accordingly, in such a case, controller 104 designates 1 which is a minimum value as the value of n, and phase comparator 101 performs the phase comparison operation in phase comparison mode A in FIG. 5A. In phase comparison mode A, data used for phase comparison from among the 2N pieces of sampling data are limited. For example, in the case where a data transition edge of reception data RXDATA is present between sampling clock CK and first clock CKLAG, first phase comparison signal LAG is activated. Here, sampling data used for phase comparison operation can be selected from the 2N pieces of sampling data.

Figure 6A:
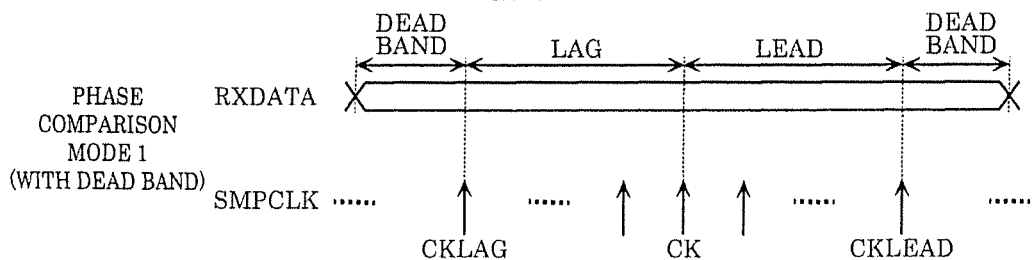
FIG. 6A is a timing chart illustrating phase comparison operation in phase comparison mode 1.
Figure 6B:
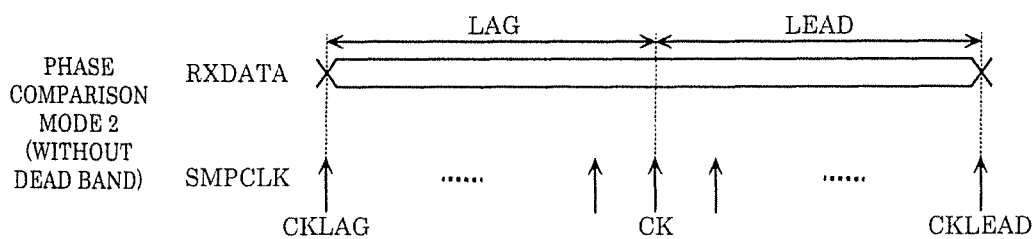
FIG. 6B is a timing chart illustrating phase comparison operation in phase comparison mode 2.

FIG. 6A is a timing chart illustrating phase comparison operation in phase comparison mode 1 in which sampling data sampled with a clock having a relatively small phase difference from sampling clock CK is used for phase comparison operation. FIG. 6B is a timing chart illustrating phase comparison operation in phase comparison mode 2 in which sampling data sampled with a clock having a relatively large phase difference from sampling clock CK is used for phase comparison operation.

As illustrated in FIG. 6A, in the case where sampling data sampled with a clock having a relatively small phase difference from sampling clock CK is used for phase comparison operation, there is a relatively large dead band in the phase comparison operation, so that the tolerance for high frequency jitter is high.

As illustrated in FIG. 6B, in the case where sampling data sampled with a clock having a relatively large phase difference from sampling clock CK is used for phase comparison operation, there is a relatively small or no dead band in the phase comparison operation, so that the tolerance for low frequency jitter is high.

Thus, controller 104 can flexibly adjust the reception characteristics of clock recovery system 10 by designating first clock CKLAG and second clock CKLEAD depending on the jitter characteristics of transmission system 40 or 50.

Figure 5B:
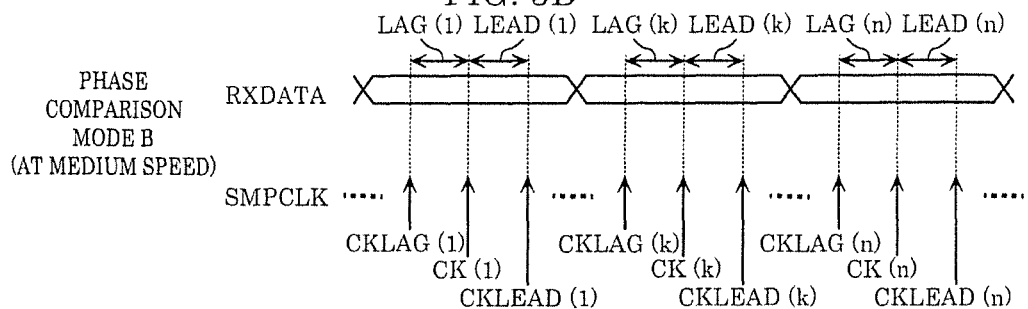
FIG. 5B is a timing chart illustrating phase comparison operation of the phase comparator.
Figure 5C:
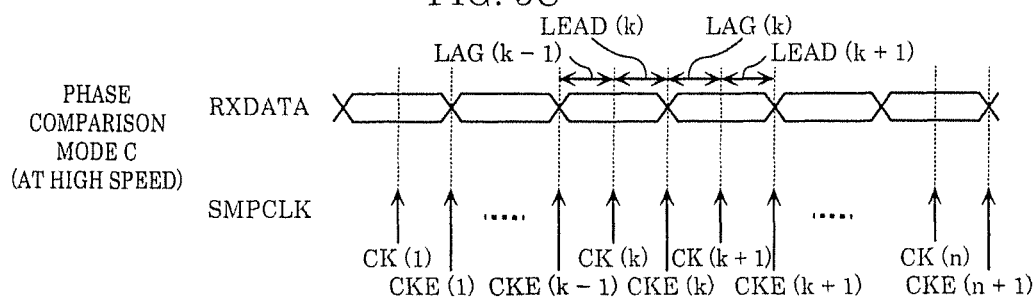
FIG. 5C is a timing chart illustrating phase comparison operation of the phase comparator.

Phase comparison mode B in FIG. 5B has data processing concurrency between phase comparison mode A in FIG. 5A and phase comparison mode C in FIG. 5C. In phase comparison mode B, too, sampling data used for phase comparison operation is selectable. Although an example in which there are three phase comparison modes of phase comparison modes A, B, and C is described here, the present disclosure is not limited to this as long as there are a plurality of phase comparison modes.

Figure 7A:
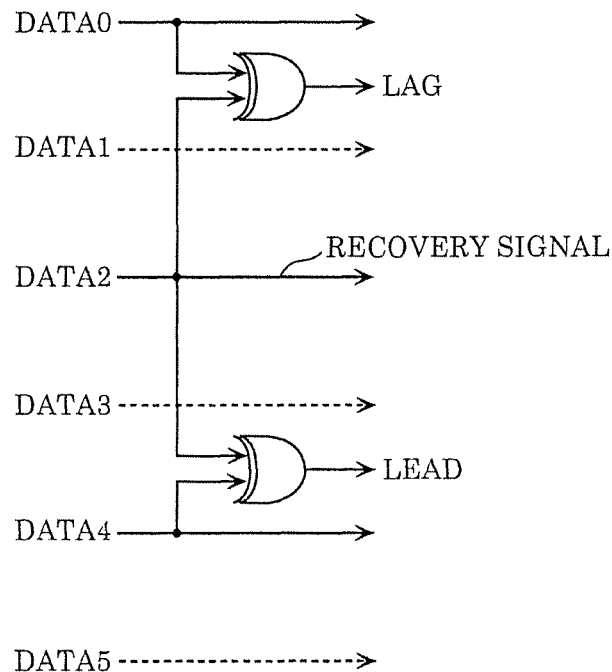
FIG. 7A is a schematic diagram illustrating a phase comparison operation example.
Figure 7B:
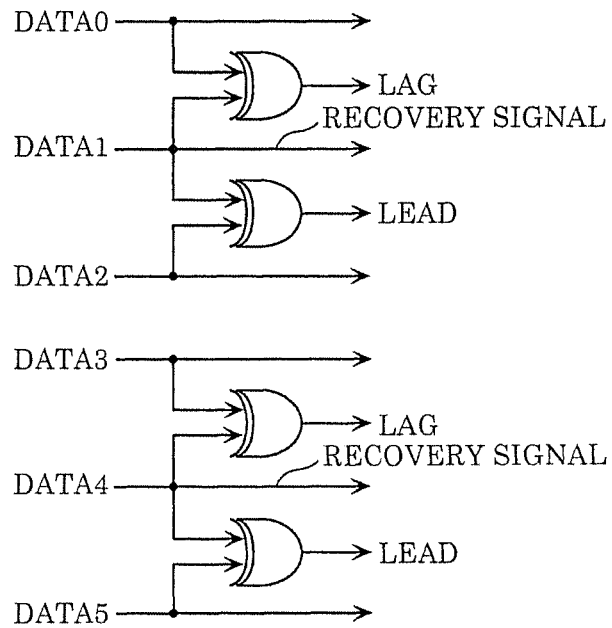
FIG. 7B is a schematic diagram illustrating a phase comparison operation example.
Figure 7C:
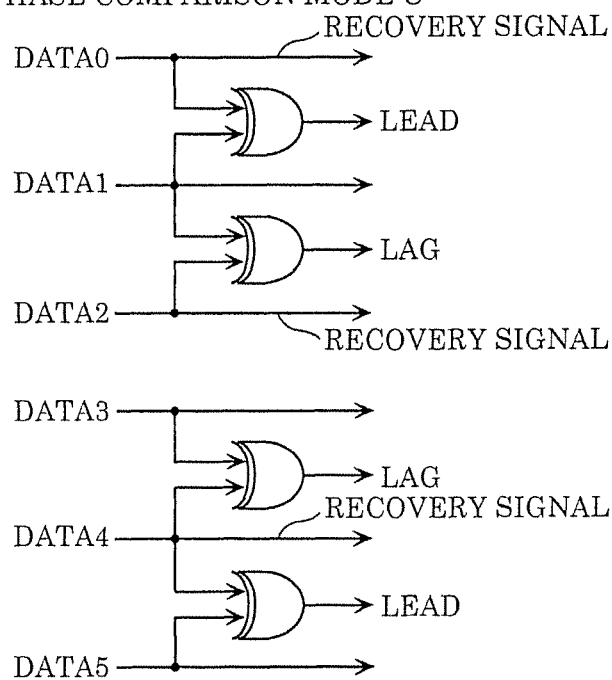
FIG. 7C is a schematic diagram illustrating a phase comparison operation example.

FIGS. 7A, 7B, and 7C are each a schematic diagram illustrating a phase comparison operation example in the case where 2N=6. FIG. 7A is a schematic diagram illustrating a phase comparison operation example in phase comparison mode A. FIG. 7B is a schematic diagram illustrating a phase comparison operation example in phase comparison mode B. FIG. 7C is a schematic diagram illustrating a phase comparison operation example in phase comparison mode C. In FIGS. 7A to 7C, DATA0 to DATA5 represent six pieces of sampling data.

In phase comparison mode A, for example, first phase comparison signal LAG is generated by exclusive OR of DATA0 and DATA2, and second phase comparison signal LEAD is generated by exclusive OR of DATA2 and DATA4, as illustrated in FIG. 7A. DATA1, DATA3, and DATA5 are not used in this example. In this case, for example, DATA2 is selected as a recovery signal. Alternatively, first phase comparison signal LAG may be generated by exclusive OR of DATA1 and DATA2, and second phase comparison signal LEAD may be generated by exclusive OR of DATA2 and DATA3. In such a case, there is a relatively large dead band, so that the tolerance for high frequency jitter is relatively high.

In phase comparison mode B, for example, first phase comparison signal LAG is generated by exclusive OR of DATA0 and DATA1 and exclusive OR of DATA3 and DATA4, and second phase comparison signal LEAD is generated by exclusive OR of DATA1 and DATA2 and exclusive OR of DATA4 and DATA5, as illustrated in FIG. 7B. In this case, for example, DATA1 and DATA4 are selected as recovery signals.

In phase comparison mode C, for example, second phase comparison signal LEAD is generated by exclusive OR of DATA0 and DATA1 and exclusive OR of DATA4 and DATA5, and first phase comparison signal LAG is generated by exclusive OR of DATA1 and DATA2 and exclusive OR of DATA3 and DATA4, as illustrated in FIG. 7C. In this case, for example, DATA0, DATA2, and DATA4 are selected as recovery signals.

Figure 8:
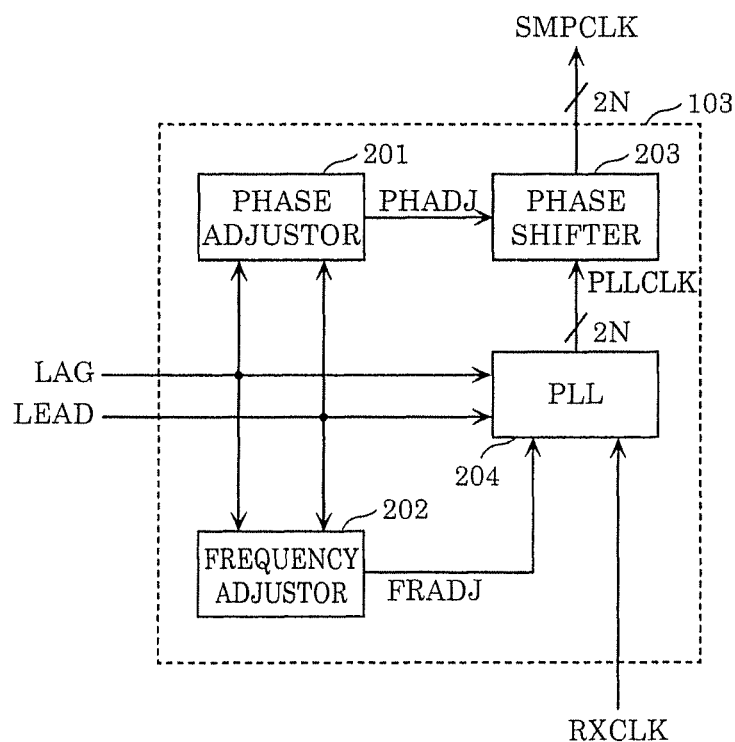
FIG. 8 is a block diagram illustrating a structure of a multiphase clock generator.

FIG. 8 is a block diagram illustrating a structure of multiphase clock generator 103. Although multiphase clock generator 103 having the structure illustrated in FIG. 8 is described here, the structure illustrated in FIG. 8 is an example, and multiphase clock generator 103 is not limited to the structure illustrated in FIG. 8.

Multiphase clock generator 13 includes phase adjustor 201, frequency adjustor 202, phase shifter 203, and PLL 204, as illustrated in FIG. 8.

Phase adjustor 201 generates phase adjustment signal PHADJ indicating the phases of 2N phase clocks SMPCLK to be output, based on first phase comparison signal LAG and second phase comparison signal LEAD.

Frequency adjustor 202 generates frequency adjustment signal FRADJ indicating the frequency of 2N phase clocks SMPCLK to be output, based on first phase comparison signal LAG and second phase comparison signal LEAD.

PLL 204, in the case where reception clock RXCLK synchronous with reception data RXDATA is input from outside, generates 2N phase PLL clocks PLLCLK by synchronization with reception clock RXCLK. In the case where reception clock RXCLK is not input from outside, PLL 204 generates 2N phase PLL clocks PLLCLK whose frequency is indicated by frequency adjustment signal FRADJ generated by frequency adjustor 202 and whose phases are based on first phase comparison signal LAG and second phase comparison signal LEAD.

Phase shifter 203, in the case where reception clock RXCLK is input from outside, performs first phase adjustment on 2N phase PLL clocks PLLCLK generated by PLL 204 to cause 2N phase PLL clocks PLLCLK to have the phases indicated by the phase adjustment signal generated by phase adjustor 201, and outputs 2N phase PLL clocks PLLCLK subjected to the first phase adjustment as 2N phase clocks SMPCLK. In the case where reception clock RXCLK is not input from outside, phase shifter 203 outputs 2N phase PLL clocks PLLCLK generated by PLL 204 as 2N phase clocks SMPCLK, without performing the phase adjustment.

By use of multiphase clock generator 103 illustrated in FIG. 8, clock recovery system 10 can support both transmission and reception system 1 illustrated in FIG. 1, i.e. a clock forward system, and transmission and reception system 2 illustrated in FIG. 2, i.e. a clock embedded system.

In transmission and reception system 1 illustrated in FIG. 1, PLL 204 performs frequency lock using reception clock RXCLK, stops phase adjustment based on first phase comparison signal LAG and second phase comparison signal LEAD, and generates and outputs 2N phase clocks PLLCLK. Phase shifter 203 performs phase adjustment on 2N phase clocks PLLCLK output from PLL 204 based on phase adjustment signal PHADJ, and outputs 2N phase clocks PLLCLK subjected to the phase adjustment as 2N phase clocks SMPCLK.

In transmission and reception system 2 illustrated in FIG. 2, PLL 204 performs frequency lock using frequency adjustment signal FRADJ, and generates and outputs 2N phase clocks PLLCLK phase-adjusted based on first phase comparison signal LAG and second phase comparison signal LEAD. Phase shifter 203 stops phase adjustment based on phase adjustment signal PHADJ, and outputs 2N phase clocks PLLCLK output from PLL 204 as 2N phase clocks SMPCLK.

Figure 9:
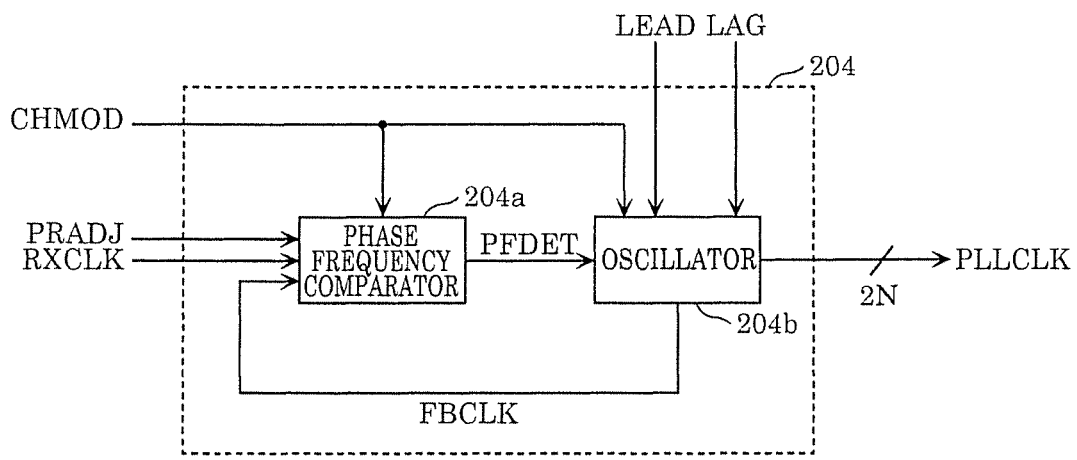
FIG. 9 is a block diagram illustrating a structure of a PLL.

FIG. 9 is a block diagram illustrating a structure of PLL 204. Although PLL 204 having the structure illustrated in FIG. 9 is described here, the structure illustrated in FIG. 9 is an example, and PLL 204 is not limited to the structure illustrated in FIG. 9.

PLL 204 includes phase frequency comparator 204a and oscillator 204b, as illustrated in FIG. 9.

Phase frequency comparator 204a operates based on mode selection signal CHMOD that is inactive in the case where reception clock RXCLK is input from outside and active in the case where reception clock RXCLK is not input from outside, as follows: In the case where mode selection signal CHMOD is active, phase frequency comparator 204a outputs frequency adjustment signal FRADJ generated by frequency adjustor 202 as phase frequency comparison result signal PFDET. In the case where mode selection signal CHMOD is inactive, phase frequency comparator 204a outputs a phase frequency comparison result between reception clock RXCLK and feedback clock FBCLK as phase frequency comparison result signal PFDET.

Oscillator 204b operates based on mode selection signal CHMOD as follows: In the case where mode selection signal CHMOD is active, oscillator 204b performs second phase adjustment based on first phase comparison signal LAG and second phase comparison signal LEAD, and generates feedback clock FBCLK and 2N phase PLL clocks. In the case where mode selection signal CHMOD is inactive, oscillator 204b generates feedback clock FBCLK and 2N phase PLL clocks PLLCLK without performing the second phase adjustment.

Figure 10:
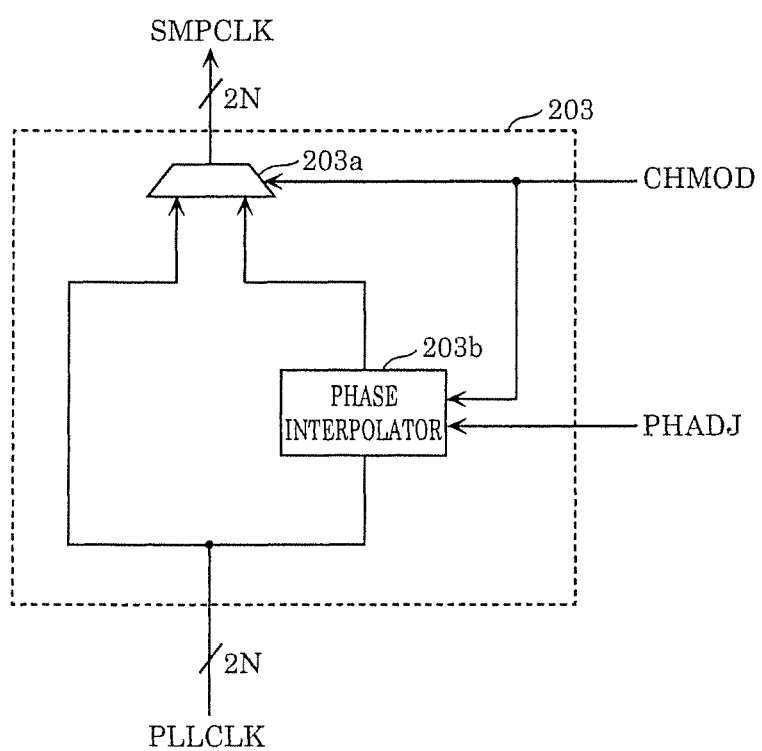
FIG. 10 is a block diagram illustrating a structure of a phase shifter.

FIG. 10 is a block diagram illustrating a structure of phase shifter 203. Although phase shifter 203 having the structure illustrated in FIG. 10 is described here, the structure illustrated in FIG. 10 is an example, and phase shifter 203 is not limited to the structure illustrated in FIG. 10.

Phase shifter 203 includes clock selector 203a and phase interpolator 203b, as illustrated in FIG. 10.

Phase interpolator 203b performs the foregoing first phase adjustment on 2N phase PLL clocks PLLCLK generated by PLL 204.

Clock selector 203a, in the case where mode selection signal CHMOD is active, selects 2N phase PLL clocks PLLCLK generated by PLL 204, and outputs them as 2N phase clocks SMPCLK. In the case where mode selection signal CHMOD is inactive, clock selector 203a selects 2N phase PLL clocks PLLCLK subjected to the first phase adjustment by phase interpolator 203b, and outputs them as 2N phase clocks SMPCLK.

In the case where mode selection signal CHMOD is active, phase shifter 203 stops the operation of phase interpolator 203b.

Variation

A clock recovery system according to a variation by changing part of the structure of clock recovery system 10 according to Embodiment 1 will be described below.

Figure 11:
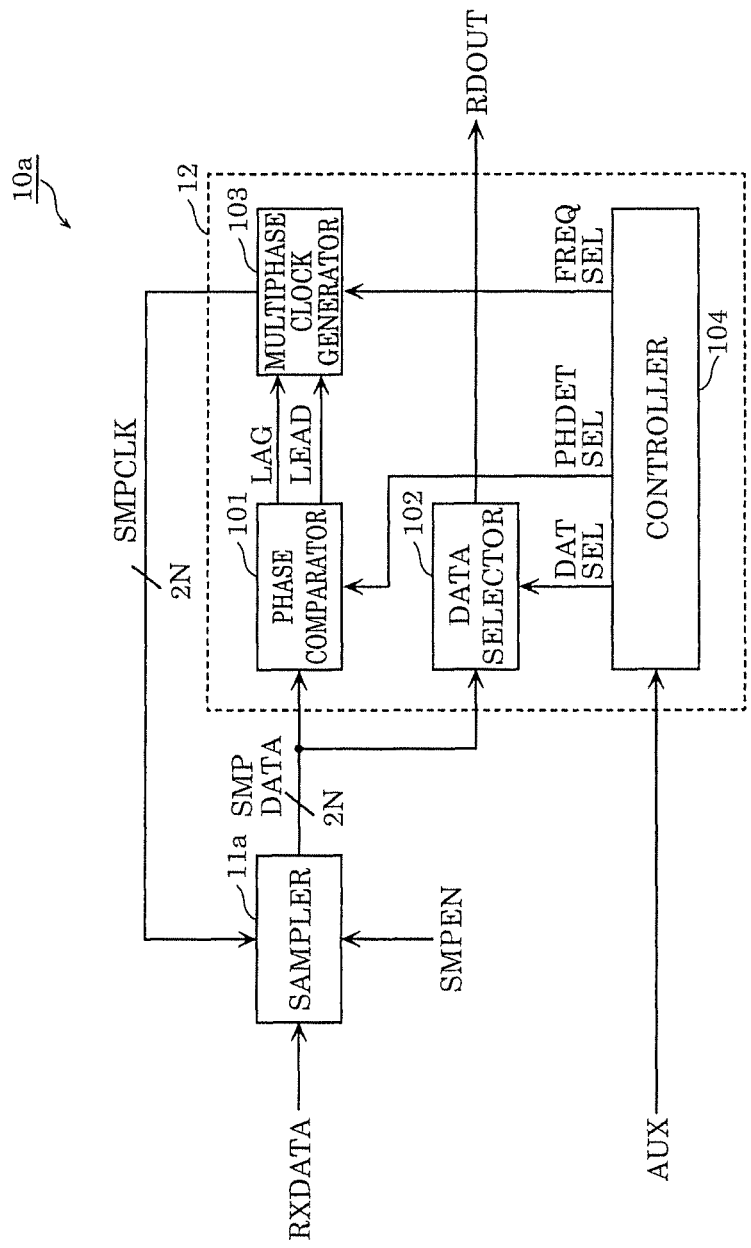
FIG. 11 is a block diagram illustrating a structure of a clock recovery system according to a variation.

FIG. 11 is a block diagram illustrating a structure of clock recovery system 10a according to the variation.

As illustrated in FIG. 11, clock recovery system 10a differs from clock recovery system 10 according to Embodiment 1 in that sampler 11a is provided instead of sampler 11. Clock recovery system 10a according to the variation will be described below with reference to drawings, mainly focusing on the differences from clock recovery system 10 according to Embodiment 1.

Figure 12:
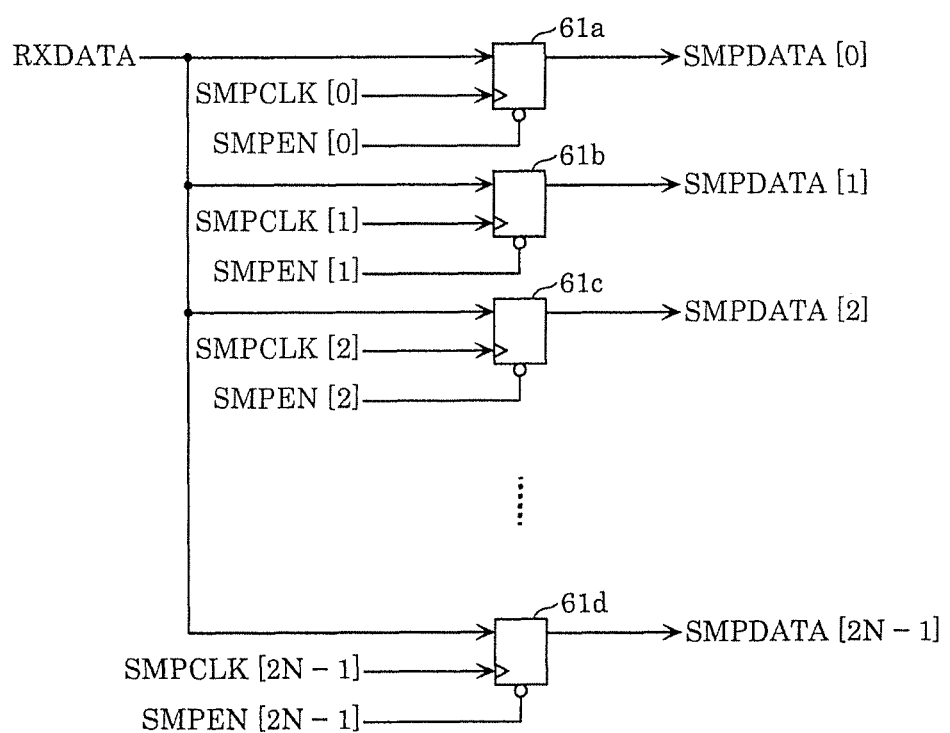
FIG. 12 is a block diagram illustrating a structure of a sampler.

FIG. 12 is a block diagram illustrating a structure of sampler 11a.

Sampler 11a includes 2N sampling circuits 61 (sampling circuits 61a to 61d in FIG. 12), as illustrated in FIG. 12. Each sampling circuit 61 is implemented by a D flip-flop circuit with an enable input. Hence, each sampling circuit 61 performs sampling operation in the case where the enable signal is active, and stops sampling operation in the case where the enable signal is inactive.

As illustrated in FIG. 12, each sampling circuit 61 receives input of different clock SMPCLK out of 2N phase clocks SMPCLK and different enable signal SMPEN[i] out of 2N enable signals SMPEN (i is an integer of 0 or more and 2N−1 or less).

With this structure, as a result of 2N enable signals SMPEN being set to appropriate values, sampler 11a can limit the sampling signals to be output to desired j sampling signals (j is an integer of 1 or more and 2N or less) from among 2N sampling signals, and output the sampling signals.

Accordingly, as a result of receiving input of a signal (hereafter also referred to as "predetermined signal") made up of 2N enable signals SMPEN that are set to enable sampling circuits 61 corresponding to n sampling signals selected by data selector 102 as recovery signals and disabling other sampling circuits 61, sampler 11a limits the sampling signals to be output per 1 clock cycle to n sampling signals selected by data selector 102 as recovery signals, and outputs the n sampling signals.

That is, in the case where the predetermined signal is input from outside, sampler 11a suppresses the operation of each sampling circuit 61 that samples a sampling signal not selected by data selector 102 as any of n recovery signals, and limits the sampling signals output per 1 clock cycle to n sampling signals selected by data selector 102 as recovery signals and outputs the sampling signals.

Thus, clock recovery system 10a of the above-described structure suppresses the sampling operation of each sampling circuit 61 that samples a sampling signal not selected as a recovery signal. This contributes to lower power consumption than in clock recovery system 10 according to Embodiment 1.

Embodiment 2

A clock recovery system according to Embodiment 2 by changing part of the structure of clock recovery system 10 according to Embodiment 1 will be described below.

Clock recovery system 10 according to Embodiment 1 is a structural example in the case where reception data RXDATA is a signal that can take two logical values.

The clock recovery system according to Embodiment 2 is a structural example in the case where reception data RXDATA is a signal (hereafter also referred to as "multivalue signal") that can take (M+1) logical values (M is an integer of 2 or more). The clock recovery system according to Embodiment 1 can then be regarded as a structural example in the case where reception data RXDATA is a signal that can take (M+1) logical values where M=1 (i.e. two values).

Figure 13:
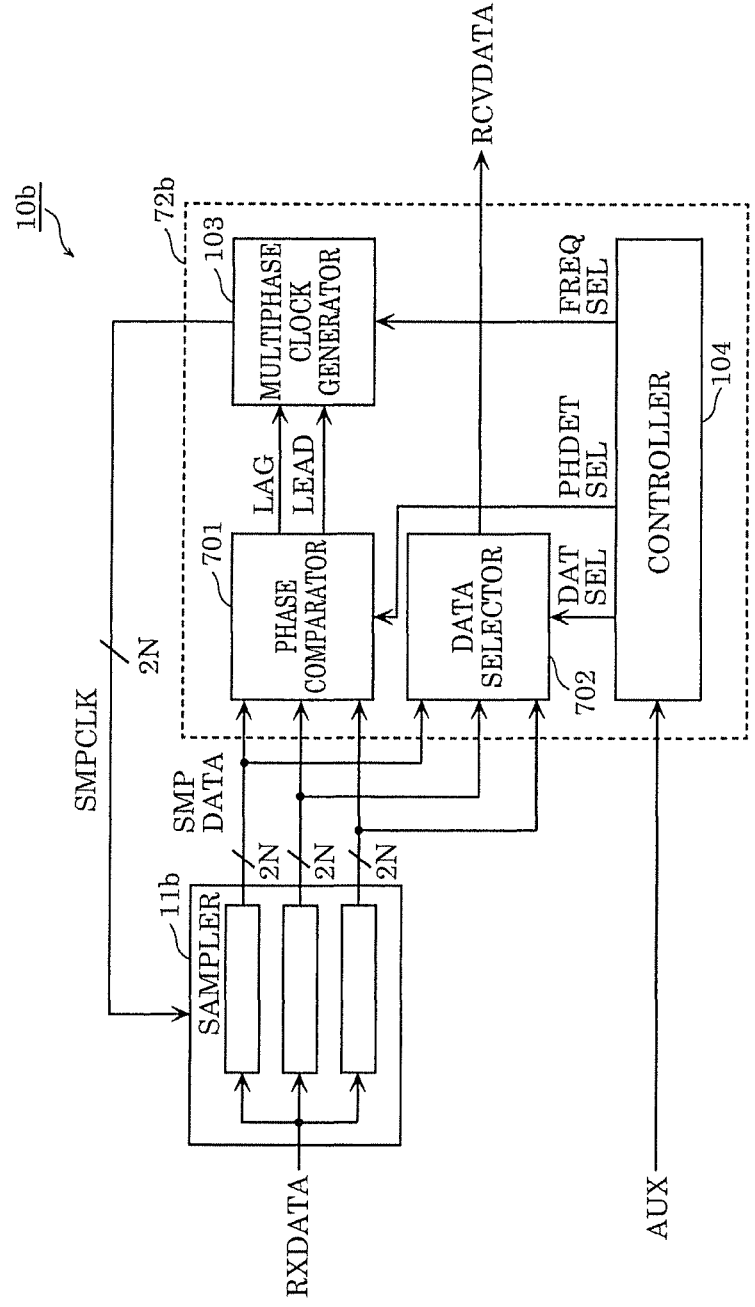
FIG. 13 is a block diagram illustrating a structure of a clock recovery system according to Embodiment 2.

FIG. 13 is a block diagram illustrating a structure of clock recovery system 10b according to Embodiment 2. Clock recovery system 10b is a structural example in the case where reception data RXDATA is a multivalue signal that can take logical signals of four values (i.e. (M+1) values where M=3).

As illustrated in FIG. 13, clock recovery system 10b differs from clock recovery system 10 according to Embodiment 1 in that sampler 11b is provided instead of sampler 11 and clock recoverer 72b is provided instead of clock recoverer 12. Clock recoverer 72b differs from clock recoverer 12 according to Embodiment 1 in that phase comparator 701 is provided instead of phase comparator 101 and data selector 702 is provided instead of data selector 102. Clock recovery system 10b according to Embodiment 2 will be described below with reference to drawings, mainly focusing on the differences from clock recovery system 10 according to Embodiment 1.

Sampler 11b includes 2N×M sampling circuits 61 (M=3 in this example). Sampler 11b samples reception data RXDATA that has passed through transmission path 20 with 2N phase clocks SMPCLK (N is an integer of 2 or more), and outputs 2N×M sampling signals SMPDATA (M=3 in this example) per 1 clock cycle.

Data selector 702b selects n×M recovery signals RCVDATA (M=3 in this example) from 2N×M sampling signals SMPDATA (M=3 in this example) and outputs selected n×M recovery signals RCVDATA, per 1 clock cycle.

Phase comparator 701, for each of n×M recovery signals RCVDATA per 1 clock cycle, outputs a phase comparison signal relating to the phases of 2N phase clocks SMPCLK based on recovery signal RCVDATA, a first sampling signal sampled with first clock CKLAG that leads by one or more phases from sampling clock CK for sampling recovery signal RCVDATA, and a second sampling signal sampled with second clock CKLEAD that delays by one or more phases from sampling clock CK.

Figure 14A:
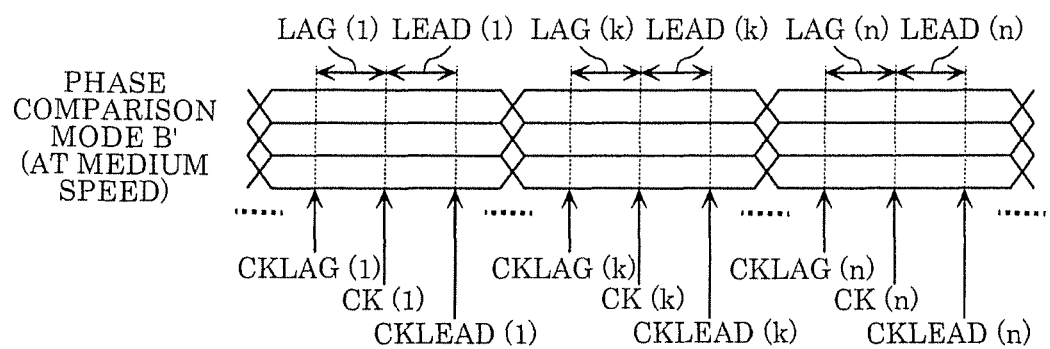
FIG. 14A is a timing chart illustrating phase comparison operation of a phase comparator.
Figure 14B:
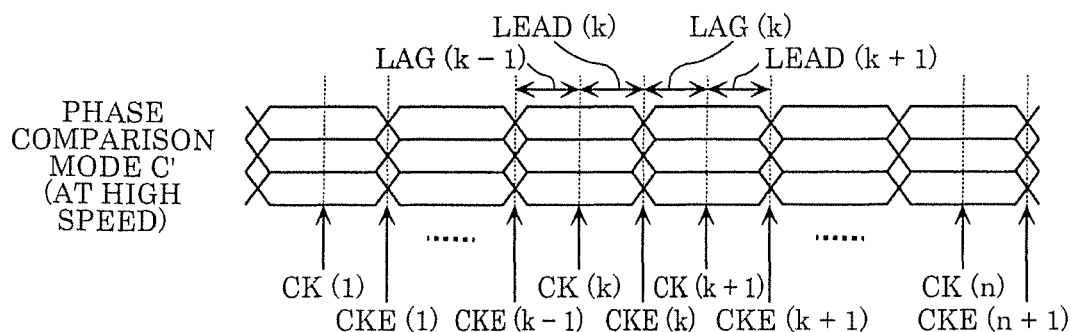
FIG. 14B is a timing chart illustrating phase comparison operation of the phase comparator.

FIG. 14A is a timing chart illustrating phase comparison operation of phase comparator 701 in the case where the data rate of reception data RXDATA is relatively medium (e.g. approximately several GHz). FIG. 14B is a timing chart illustrating phase comparison operation of phase comparator 701 in the case where the data rate of reception data RXDATA is relatively high (e.g. approximately a dozen GHz).

As illustrated in FIGS. 14A and 14B, phase comparator 701 performs phase comparison for a multivalue signal. The phase comparison method may be, for example, based on transition of one piece of data of a multivalue signal, or based on transition of all pieces of data.

For example, in phase comparison, data transitions that phase comparator 701 reacts to may be partially restricted.

Figure 15:
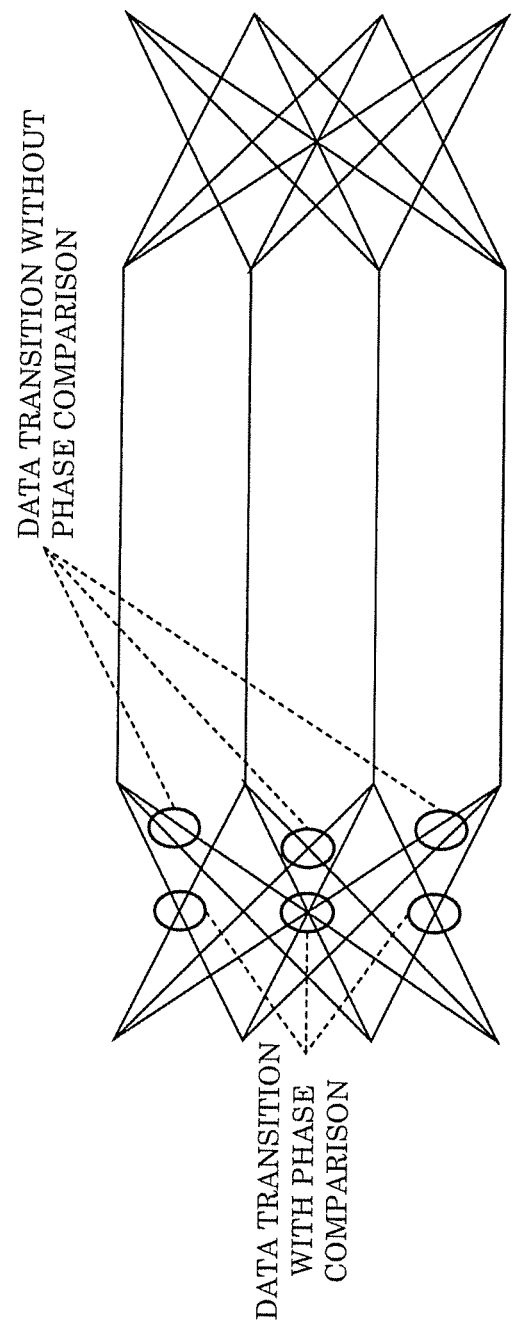
FIG. 15 is a schematic diagram illustrating a state in which data transitions that the phase comparator reacts to are partially restricted.

FIG. 15 is a schematic diagram illustrating a state in which data transitions that phase comparator 701 reacts to are partially restricted in phase comparison performed by phase comparator 701.

In this example, the reaction of phase comparator 701 to data transitions that occur on the side closer to the center of data from among data transitions is restricted as illustrated in FIG. 15. Phase comparator 701 in this example can thus be prevented from reacting to unwanted transition jitter in a multivalue signal.

Supplemental Remarks

While the presently disclosed techniques have been described by way of embodiments such as Embodiments 1 and 2 and variations as examples, the presently disclosed techniques are not limited to such, and changes, replacements, additions, omissions, and the like can be made to the embodiments.

Examples of further variations of the present disclosure will be described below.

(1) The foregoing variation describes the case where each of 2N sampling circuits 61 in clock recovery system 10a receives input of different enable signal SMPEN out of 2N enable signals SMPEN, but clock recovery system 10a is not limited to this structure. As another example, clock recovery system 10a may have a structure in which 2N sampling circuits 61 are divided into L groups (L is an integer of 2 or more and less than 2N), and, for each group, sampling circuits 61 belonging to the group receive input of common enable signal SMPEN. In such a case, the number of enable signals SMPEN is L.

(2) Embodiment 2 describes the case where reception data RXDATA is a multivalue signal that can take logical signals of four values (i.e. (M+1) values where M=3) in clock recovery system 10b, but clock recovery system 10b is not limited to the case where reception data RXDATA is a multivalue signal that can take logical signals of four values (i.e. (M+1) values where M=3). For example, in the case where reception data RXDATA is a multivalue signal that can take logical signals of three values (i.e. (M+1) values where M=2), clock recovery system 10b can be implemented according to the description of Embodiment 2 with M being set to 2.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to systems that receive signals transmitted from outside.

What is claimed is:

1. A clock recovery system that receives reception data, the clock recovery system comprising:

a sampler that samples the reception data with 2N phase clocks, and outputs 2N×M sampling signals per 1 clock cycle, where N and M are each an integer of 1 or more;

a data selector that selects n×M recovery signals from the 2N×M sampling signals and outputs the n×M recovery signals per 1 clock cycle, where n is an integer of 1 or more and N or less;

a phase comparator that, for each recovery signal of the n×M recovery signals per 1 clock cycle, outputs a phase comparison signal relating to phases of the 2N phase clocks based on the recovery signal, a first sampling signal sampled with a first clock that leads by one or more phases from a sampling clock for sampling the recovery signal, and a second sampling signal sampled with a second clock that delays by one or more phases from the sampling clock;

a controller that designates a value of n based on a data rate of the reception data; and a multiphase clock generator that generates and outputs the 2N phase clocks whose frequency is 1/n of the data rate of the reception data, based on the phase comparison signal output from the phase comparator and the value of n designated by the controller, wherein the multiphase clock generator includes:

a phase adjustor that generates a phase adjustment signal indicating the phases of the 2N phase clocks to be output, based on the phase comparison signal;

a frequency adjustor that generates a frequency adjustment signal indicating the frequency of the 2N phase clocks to be output, based on the phase comparison signal;

a phase locked loop (PLL) that: in the case where a reception clock synchronous with the reception data is input from outside, generates 2N phase PLL clocks by synchronization with the reception clock; and in the case where the reception clock is not input from outside, generates the 2N phase PLL clocks whose frequency is indicated by the frequency adjustment signal generated by the frequency adjustor and whose phases are based on the phase comparison signal; and a phase shifter that: in the case where the reception clock is input from outside, performs first phase adjustment on the 2N phase PLL clocks generated by the PLL to cause the 2N phase PLL clocks to have the phases indicated by the phase adjustment signal generated by the phase adjustor, and outputs the 2N phase PLL clocks subjected to the first phase adjustment as the 2N phase clocks; and in the case where the reception clock is not input from outside, outputs the 2N phase PLL clocks generated by the PLL as the 2N phase clocks without performing the first phase adjustment.

2. The clock recovery system according to claim 1, wherein M=1.

3. The clock recovery system according to claim 1, wherein the phase comparator outputs, as the phase comparison signal: a first phase comparison signal activated in the case where a data transition edge of the reception data is present in a first period between a timing of sampling by the sampling clock and a timing of sampling by the first clock, based on the recovery signal and the first sampling signal; and a second phase comparison signal activated in the case where the data transition edge of the reception data is present in a second period between the timing of sampling by the sampling clock and a timing of sampling by the second clock, based on the recovery signal and the second sampling signal, and the multiphase clock generator: in the case where the first phase comparison signal activated is output from the phase comparator, generates the 2N phase clocks by delaying the phases of the 2N phase clocks; and in the case where the second phase comparison signal activated is output from the phase comparator, generates the 2N phase clocks by advancing the phases of the 2N phase clocks.

4. The clock recovery system according to claim 1, wherein the controller designates, from the 2N phase clocks, one of clocks that each lead by one or more phases from the sampling clock as the first clock, and one of clocks that each delay by one or more phases from the sampling clock as the second clock.

5. The clock recovery system according to claim 3, wherein the PLL includes:

a phase frequency comparator that outputs a phase frequency comparison result signal; and an oscillator that generates a feedback clock and the 2N phase PLL clocks based on the phase frequency comparison result signal output from the phase frequency comparator, based on a mode selection signal that is inactive in the case where the reception clock is input from outside and active in the case where the reception clock is not input from outside, the phase frequency comparator: in the case where the mode selection signal is active, outputs the frequency adjustment signal generated by the frequency adjustor as the phase frequency comparison result signal; and in the case where the mode selection signal is inactive, outputs a phase frequency comparison result between the reception clock and the feedback clock as the phase frequency comparison result signal, and based on the mode selection signal, the oscillator: in the case where the mode selection signal is active, performs second phase adjustment based on the first phase comparison signal and the second phase comparison signal, and generates the feedback clock and the 2N phase PLL clocks; and in the case where the mode selection signal is inactive, generates the feedback clock and the 2N phase PLL clocks without performing the second phase adjustment.

6. The clock recovery system according to claim 5, wherein the phase shifter includes:

a phase interpolator that performs the first phase adjustment on the 2N phase PLL clocks generated by the PLL; and a clock selector that, based on the mode selection signal: in the case where the mode selection signal is active, selects the 2N phase PLL clocks generated by the PLL and outputs the 2N phase PLL clocks as the 2N phase clocks; and in the case where the mode selection signal is inactive, selects the 2N phase PLL clocks subjected to the first phase adjustment by the phase interpolator and outputs the 2N phase PLL clocks subjected to the first phase adjustment as the 2N phase clocks.

7. The clock recovery system according to claim 1, wherein the sampler includes 2N×M sampling circuits that each sample the reception data once per 1 clock cycle, and in the case where a predetermined signal is input from outside, the sampler suppresses operation of each sampling circuit that samples a sampling signal not selected by the data selector as any of the n×M recovery signals, to limit sampling signals output per 1 clock cycle to n×M sampling signals selected by the data selector as recovery signals and output the sampling signals.

8. The clock recovery system according to claim 1,
wherein in the case where the reception clock is received, the controller designates the value of n using a cycle of the reception clock as the data rate.

9. The clock recovery system according to claim 1,
wherein in the case where a clock information signal indicating a shortest data transition cycle of the reception data is received, the controller designates the value of n using the data transition cycle indicated by the clock information signal as the data rate.

\* \* \* \* \*